United States Patent
Naum et al.

(10) Patent No.: US 8,253,321 B2
(45) Date of Patent: Aug. 28, 2012

(54) WARM-WHITE LIGHT EMTITTING DIODE AND ITS HALIDE PHOSPHOR POWDER

(75) Inventors: Soshchin Naum, Changhua (TW); Wei-Hung Lo, Taipei (TW); Chi-Ruei Tsai, Taipei (TW)

(73) Assignee: Wei-Hung Lo, Shanghai (CN)

( * ) Notice: Subject to any disclaimer, the term of this patent is extended or adjusted under 35 U.S.C. 154(b) by 182 days.

(21) Appl. No.: 12/543,613

(22) Filed: Aug. 19, 2009

(65) Prior Publication Data

US 2010/0044729 A1  Feb. 25, 2010

(30) Foreign Application Priority Data

Aug. 22, 2008  (TW) ............... 97132027 A

(51) Int. Cl.
  C09K 11/70  (2006.01)
  H01L 29/26  (2006.01)
(52) U.S. Cl. ...... 313/503; 257/13; 257/79; 252/301.4 P; 250/484.4
(58) Field of Classification Search ............. 257/13; 313/503; 252/301.4 P; 250/484.4
  See application file for complete search history.

(56) References Cited

U.S. PATENT DOCUMENTS

| 6,409,938 | B1 | 6/2002 | Comanzo |
| 2008/0138268 | A1* | 6/2008 | Tao et al. ............ 423/263 |
| 2008/0290355 | A1* | 11/2008 | Naum et al. ............ 257/94 |
| 2009/0105065 | A1* | 4/2009 | Bechtel et al. ............ 501/152 |

FOREIGN PATENT DOCUMENTS

| JP | 2007133487 | 5/2007 |
| TW | I249567 | 2/2006 |
| TW | 95117824 | 5/2006 |
| TW | 097123219 | 6/2008 |

* cited by examiner

Primary Examiner — N Drew Richards
Assistant Examiner — Peter Bradford
(74) Attorney, Agent, or Firm — Guice Patents PLLC

(57) ABSTRACT

The invention relates to a halide phosphor powder for warm-white light emitting diode, which is a kind of low-color-temperature phosphor powder of halide nitride based on garnet of rare earth oxides, uses cerium as activating agent and is characterized in that chloride ($Cl^{-1}$) and nitrogen ion ($N^{-3}$) are added to the composition of the phosphor powder and its stoichiometric relationship of the composition is $(\Sigma Ln^{+3})_3 Al_2 [(Al(O_{1-2p}Cl_p N_p)_4]_3$, wherein $\Sigma Ln$ is $\Sigma Ln=Y$ and/or Gd and/or Tb and/or Lu and/or Dy and/or Pr and/or Ce. In addition, the invention also discloses a use of a warm-white light emitting diode of the said phosphor powder with a weight ratio of 8 to 75%. The light emitting diode has a warm-red color temperature $T \leq 3000$ K when it has a power of 1 watt.

7 Claims, 5 Drawing Sheets

Spectral Distribution

WARM-WHITE LIGHT EMTITTING DIODE AND ITS HALIDE PHOSPHOR POWDER

FIELD OF THE INVENTION

The present invention relates to a warm-white light emitting diode and its halide phosphor powder, in particular a warm-white light emitting diode and its halide phosphor powder that can improve production technology and create various classes of indicating devices in relation to domiciles, street lamps, train stations, tunnels, railways and flight paths.

DESCRIPTION OF THE PRIOR ART

In the recent fifty years, semiconductor light emitting diodes have been developed perfectly. The development from the conventional system structure of gallium arsenic phosphide (GaAsP) to the heterostructure of indium gallium nitride (InGaN) ensures the present high light emission technology parameters, light emission intensity I and light emission efficiency $\xi$ (lumen per watt).

The Japanese pioneer worker of the lighting emitting diode, S. Nakanura (please refer to S. Nakanura, Blue laser, Springer-Verlag Berlin, 1997) created and perfected this technique by processing nitride InGaN-based heterostructure with a large amount of quantum wells. The blue and ultra violet light emitting diodes in this work outputted $F \geqq 10$ lumens and possessed 40% or higher electronic power conversion in the light emitting diodes. Using such relatively efficient blue-light heterostructure light emitting diodes had ever been proposed in the initial white light-emitting structure (please refer to US publication No. 20071149914 proposed by S. Shimizu et al.).

The light emitting diode is based upon the theory of the Newton complementary color and combines two kinds of complementary colors to create a white light. White light emitting diodes employ Stoke's phosphor powder that possesses an emitting wavelength larger than an exciting wavelength and this was for the first time proposed by an engineer of the Soviet Union in 1977 (please refer to CCCP No. 630813, Sep. 12, 1977).

For the first creative employment of yttrium aluminium garnet (Y2Al5O12):Ce (please refer to G Blasse et al., Luminescent material. Springer Verl, Amst. N-Y, 1994), the white light emitting diode is used in the CRT lighting devices. The blue-light radiation wavelength of the nitride heterostructure InGaN is $\lambda=460$ nm. The excited material radiates yellow light with a wavelength of 560 nm. At the moment, partial blue and yellow lights that are not absorbed combine with each other to generate a strong white-light radiation. The white-light radiation structures of the first-time light emitting diodes mostly have high color temperature ($T \geqq 6500$ K).

The proposed high-technology resolutions were adopted in the abovementioned patent application (please refer to Y. Shimizu et al., US publication No. 20071149914), wherein their principal technical advantages can be summarized as follows: 1. lack of mobile components, nodes and elements to ensure the highly efficient safety and durability of the light emitting diodes; 2. simple structures of packaging and independent components of semiconductor heterostructure; and 3. capable of obtaining cold-white light of $T \geqq 6500$ K.

The abovementioned advantages ensure the known structures are quantitatively employed in the fields of architectural lighting and landscape lighting as well as in the energy-saving devices of cell phone battery.

It was proposed for the first time in the data model of prior patents to make use of yttrium aluminium garnet $Y_3Al_5O_{12}$: Ce (YAG:Ce) in the phosphor powder. However, drawbacks still remain. First of all, it has been already pointed out that the color temperature T of the cold-white light is $T \geqq 6500$K.

It was shown in the work that the radiation of the phosphor powder of the yttrium aluminium garnet was unstable. Emitted light was reduced by 15~35% after strong light for 1000 hours when combined with polymers based on epoxy resin. The reason for such a condition lies in that the interactions between the surface of the phosphor powder and the polymers are irreversible. This leads to a partial loss of the transmittance.

The drawback of such a strong-light radiation is also presented in the prior patent, for example establishing phosphor powder of yttrium aluminium garnet and non-stoichiometric phosphor powder of garnet (please refer to Soshchin N. P. et al., TW249567B5) and garnet material of mixtures containing aluminium ($Al^{+3}$) or silicon ($Si^{+4}$) (please refer to Soshchin N. P. et al., TW95117824, May 19, 2006) and (please refer to Soshchin N. P. et al., JP2007133487, May 18, 2007).

The solved part enables many problems of phosphor powder of garnet and establishment of new-type lighting materials to be solved excellently.

Phosphor powders with relatively high parameters, wherein a rare earth ion is surrounded by a tetrahedronal oxygen ion. However, some of oxygen ions ($O^{-2}$) were replaced by fluoride ($F^{-1}$) and nitrogen ion ($N^{-3}$). The stoichiometric equation is as follows: $O_O+O_O \rightarrow (N_o)^\circ+(F_o)'$.

When such special highly heat-resistant and time-stable phosphor powders are used to achieve a power (W=1 watt), the light emitting power can be achieved up to 105 lumens/watt.

In the structure of garnet, aluminium and oxygen can be replaced by other ions, such as $F^{-1}$, $Cl^{-1}$, $Si^{+4}$ and $B^{+3}$. In the chemical equivalent formula of $(Y,Gd,Lu)_3Al_5O_{12}$, some of aluminium ions ($Al^{+3}$) are replaced by $Si^{+4}$, $B^{+3}$ and $Ga^{+3}$ and some of oxygen ions are replaced by $F^{-1}$, $Cl^{-1}$, $S^{-2}$ and $P^{-3}$. The concrete amount of mixture was not mentioned in the patent. It merely pointed out the luminance of the phosphor powder is increased by 20% by adding fluoride. However, it pointed out in the similar U.S. Pat. No. 6,400,938B1/Jun. 25, 2002 that the insufficiency of the patent can be seen from the formula of fluoride garnet: $(Y,Ce,Gd)_3Al_5(O,F)_{12}$ (please refer to H. A. Comanzo. et al., U.S. Pat. No. 6,409,938 B1, Jun. 25, 2002). The advantages of the technical solution in the patent are described as followed: 1. it is possible to change the anions in the composition of the phosphor powder and so are the cations; 2. the luminance of the phosphor powder is increased by 10~20% by adding fluoride ($F^{-1}$).

In the patent application (please refer to Soshchin N. P. et al., TW097123219) filed by the applicant of this case (please refer to Soshchin N. P. et al., Taiwan Appl. No. 09712319, Jun. 25, 2008), the general advantages of the series of fluoride oxide garnet were pointed out as follows: 1. the radiation spectrum of the fluoride garnet is $\lambda=531$~550 nm; 2. the high heat-resistance of the phosphor powder radiation is due to replacement of oxygen ions ($O^{-2}$) by heterovalent ions ($F^{-1}$).

Likewise in the patent, the garnet lattice parameter of the phosphor powder (a=11.951~11.99 Å) was specified. Such a detailed parameter in the preceding Taiwan Application No. 097123219 has its advantage and is combined with special garnet phosphor powder.

SUMMARY OF THE INVENTION

To solve the abovementioned drawbacks of the prior art, the principal purpose of the invention is to provide a warm-white light emitting diode and its halide phosphor powder which has special phosphor powder formula of orange-red radiation lighting.

To solve the abovementioned drawbacks of the prior art, the principal purpose of the invention is to provide a warm-white light emitting diode and its halide phosphor powder, which are produced in a large batch manner and hence need to draw up a procedure for a reliable technical operation. In addition, the establishment of new-type phosphor powders is focused to raise their effective quantum efficiency and light emission luminance.

To solve the abovementioned drawbacks of the prior art, the principal purpose of the invention is to provide a warm-white light emitting diode and its halide phosphor powder, which can establish a new-type technical solution and is not limited to establishment of new-type inorganic phosphor powder materials, and which also includes creation of durable lighting emitting diodes with heat-stability and high parameters of light emission.

To achieve the abovementioned purposes, a halide phosphor powder of the invention, which is a kind of low-color-temperature phosphor powder of halide nitride based on garnet of rare earth oxides, uses cerium as activating agent and is characterized in that chloride ($Cl^{-1}$) and nitrogen ion ($N^{-3}$) are added to the composition of the phosphor powder and its stoichiometric relationship of the composition is $(\Sigma Ln^{+3})_3 Al_2 [(Al(O_{1-2p}Cl_p N_p)_4]_3$, wherein $\Sigma Ln$ is $\Sigma Ln = Y$ and/or Gd and/or Tb and/or Lu and/or Dy and/or Pr and/or Ce.

To achieve the abovementioned purposes, a warm-white light emitting diode of the invention, where an InGaN-based semiconductor heterostructure is served as matrix and which has a conversion layer of light emission, is characterized in that the conversion layer of light emission is distributed in form of thickness uniformity on the surface of light emission and the lateral sides of the InGaN-based semiconductor heterostructure and directly comes in contact with the flat surface and the prismatic face of the InGaN-based semiconductor heterostructure.

The technical solutions proposed in the invention are not limited to the formulation of inorganic phosphor powder. Their orientation is to establish a highly light-radiating instrument with high intensity I of light emission, high value of light flux, a low-color-temperature value of T=3000K and necessary color rendering values during the invention. The light emitting diode proposed in the invention shall ensure that the high parameters of light-emitting technology are generally applicable to museums, show rooms and exhibition halls.

DETAILED DESCRIPTION OF THE PREFERRED EMBODIMENT

First of all, the purpose of the invention is to eliminate the above-mentioned drawbacks of the phosphor powder. To achieve this purpose, a halide phosphor powder of the invention, which is used in a warm-white light emitting diode and is a kind of low-color-temperature phosphor powder of halide nitride based on garnet of rare earth oxides, uses cerium as activating agent and is characterized in that chloride ($Cl^{-1}$) and nitrogen ion ($N^{-3}$) are added to the composition of the phosphor powder and its stoichiometric relationship of the composition is:

wherein $\Sigma Ln$ is $\Sigma Ln = Y$ and/or Gd and/or Tb and/or Lu and/or Dy and/or Pr and/or Ce, wherein the chemical parameter in the stoichiometric relationship is $0.001 \leq p \leq 0.2$, wherein in the composition of the cation sublattice of the halide phosphor powder, the most optimal compositions of the rare earth ions are shown as follows: $0.001 \leq (Y/\Sigma Ln) \leq 0.5$, $0.5 \leq (Gd/\Sigma Ln) \leq 0.95$, $0 \leq (Tb/\Sigma Ln) \leq 0.1$, $0 \leq (Lu/\Sigma Ln) \leq 0.05$, $0 \leq (Dy/\Sigma Ln) \leq 0.05$, $0.0001 \leq (Pr/\Sigma Ln) \leq 0.01$ and $0.01 \leq (Ce/\Sigma Ln) \leq 0.1$, wherein the principal lattice parameter a of the halide phosphor powder is $a \geq 12.01$ Å and increases with the rise of the chemical index "p" in the formula, wherein the maximal radiation wavelength (λ) in the spectrum of the halide phosphor powder amounts to λ=580±3 nm and shifts to a longer wavelength with the rise of the chemical index p in the formula, wherein the spectral half width is enlarged to $\lambda_{0.5}=126+6$ nm when the chemical index p in the halide phosphor powder matrix increases, wherein the chromaticity coordinate is enlarged to $\Sigma(x+y) > 0.88$ when the chemical index p in the halide phosphor powder matrix increases, wherein the quantum output is accumulated from ζ=0.92 to ζ=0.96 when the chemical index p in the halide phosphor powder matrix increases, wherein the particles of the halide phosphor powder are in form of prism and the median particle diameter of the phosphor powder is $d_{50} \leq 4.0$ μm or $d_{90} \leq 16$ μm.

When the phosphor powder according to the invention is compared with the prior phosphor powder, their difference lies in that oxygen ions ($O^{-2}$) in the anion lattice are simultaneously replaced by two ions with different degree of oxidation, such as chloride ion ($Cl^{-1}$) and nitrogen ion ($N^{-3}$).

Assuredly, in contrast to the publications prior to employment of the phosphor powder according to the invention (please refer to H. A. Comanzo. et al., U.S. Pat. No. 6,409,938 B1, Jun. 25, 2002), each atom with three-valent-state in the phosphor powder according to the invention, such as aluminium ion ($Al^{+3}$) surrounded in the tetrahedronal $AlO_4$, can be converted to $AlO_2 Cl^{-1} N^{-3}$.

Such essential alteration of the anion composition, where a heterovalent replacement occurs in the course. The equations are shown as follows:

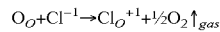

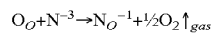

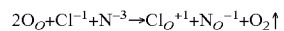

wherein $Cl_O^{+1}$ means that the existing chloride ion ($Cl^{-1}$) replaces the oxygen ion ($O_o$) in the anion lattice, while $N_O^{-1}$ implicates that the nitrogen ion ($N^{-3}$) replaces the oxygen ion ($O_o$) in the anion lattice.

Likewise, the cation lattice can be altered. The main parts of the cation lattice of the conventional rare earth ions, such as $Y^{+3}$, $Gd^{+3}$, $Lu^{+3}$ and $Tb^{+3}$, can be introduced with $Dy^{+3}$ and $Pr^{+3}$ that include Ce at the same time. The phosphor powders may contain two or more initiating ions, such as $Ce^{+3}$ and $Pr^{+3}$ as well as $Ce^{+3}$ and $Dy^{+3}$, or contains the three ions at the same time. Similar phosphor powders with multiple initiating ions gain broader integrated red-light spectral radiation and can alter color segment of light emission.

In addition, there is an important three-valent-state phosphor powder used as multiple-activating agent. The phosphor powder belongs to the phosphor powder of rare earth garnet and has a cubic structure and a spatial combination of $O_n^{10}$— Ia3d. For the garnet type—$Y_3 Al_5 O_{12}$, the activating agent $Ce^{+3}$ has, however, very narrow exciting zones, from λ=445 to 475 nm. In the connection, the exciting zone restricts the shift of $Ce^{+3}$—$O^{-2}$ with each other. The activated cerium ion $Ce^{+3}$ around the phosphor powder of garnet may be in the tetrahedron to combine with three-valent state and fill $AlO_2F^{-1}N^{-3}$. Accordingly, the exciting zone is essentially enlarged. The demand on the exciting wavelength of the semiconductor heterostructure can be reduced in this way. If the radiation wavelength ($\lambda$=440 nm) of the initial heterostructure InGaN is introduced under this condition, it has larger radiation wavelength ($\lambda_{ext}$=400~485 nm) of light emitting diode.

The three-valent-state phosphor powders as mentioned above have very essential advantages, characterized in that the rare earth ion components set up in the cation lattice are shown as follows: $0.001 \leq (Y/\Sigma Ln) \leq 0.5$, $0.5 \leq (Gd/\Sigma Ln) \leq 0.95$, $0 \leq (Tb/\Sigma Ln) \leq 0.1$, $0 \leq (Lu/\Sigma Ln) \leq 0.05$, $0 \leq (Dy/\Sigma Ln) \leq 0.05$, $0.0001 \leq (Pr/\Sigma Ln) \leq 0.01$, $0.01 \leq (Ce/\Sigma Ln) \leq 0.1$.

The phosphor powder will increase warm-red light radiation when the concentration of gadolinium ion ($Gd^{+3}$) in the formulation of the cation lattice is raised against the yttrium ion ($Y^{+3}$). The simultaneous introduction of other rare earth ion components in the cation lattice has an effect to alter the light emission intensity, for example by introducing $Lu^{+3}$ and $Tb^{+3}$. $Tb^{+3}$ ($\tau$=0.85 Å) and $Lu^{+3}$ ($\tau$=0.81 Å), both of which have relatively smaller ionic radius, are first introduced and this leads to shortening of the distance between the atoms and subsequently to intensive increase in the electrostatic force field of the internal crystal. When activated ions $Ce^{+3}$, $Pr^{+3}$ and $Dy^{+3}$ are introduced, the luminance of light emission will be increased.

Like the phosphor powder described in the invention, it is characterized in that the lattice parameter rises to a=12.01 Å when the "p" value in the stoichiometric formula of the phosphor powder becomes larger.

Like the description cited above, the lattice parameters, among the parameters of the Y—Gd—Tb—Lu series, are With respect to composition of $(Y_{0.77}Gd_{0.2}Ce_{0.03})_3Al_2(AlO_3F_2)_3$, the applicant of this case has ever confirmed the parameter value (a=11.972 Å) in the patent application (please refer to Soshchin N. P. et al., Taiwan Appl. No. 097123219). If 25% of oxygen ions ($O^{-2}$) are replaced by fluoride ions ($F^{-1}$), the magnitude of the parameter is reduced by 1~1.2%. For the effect on tetrahedron of aluminium fluoride oxide, the variation of its range lies in that generation of a fluoride ion does not alter its main $Al^{+3}$ structure. When oxygen ions ($O^{-2}$) are replaced by chloride ions ($Cl^{-1}$) of the same particle size, the magnitude of the parameter is increased by 0.1%. The lattice parameters shall be added when oxygen ions ($O^{-2}$) are replaced by nitrogen ions ($N^{-3}$) in the tetrahedron for the second time. It is, however, theoretically difficult to add these values at the moment.

Actually, nitrogen ions ($N^{-3}$) have a larger particle size, compared with oxygen ions ($O^{-2}$) ($a_{N-3}$=1.58 Å, $a_{O-2}$=1.4 Å). However, most of the added ions of larger radius decrease the values of the tetrahedron. When the ionic radius of nitrogen ions ($N^{-3}$) is compared with that of oxygen ions ($O^{-2}$), its parameter values may be considered by 1.5~2% of the same. When all of 25% of oxygen atoms ($O^{-2}$) are replaced by nitrogen ions, the existing lattice parameters of $(AlO_2F^{-1}N^{-3})_3$ must be altered in the same direction: reduction in introduction of fluoride ions ($F^{-1}$) and increase in nitrogen ions ($N^{-3}$). For such samples, the parameter composition is as follows: a=11.979 (1.02−1+0.988) Å=12.0748 Å.

The measurement on the colorimetric performance parameters of the phosphor powder according to the invention can be carried out by means of a spectral radiation analyzer of Co. "Sensing", whereby five phosphor powders with different parameters (chromaticity coordinate in the xyz and uvw systems, maximal radiation spectrum and radiation wavelength, color temperature value, color rendering coefficient Ra) are employed. These five data used are summarized in table 1:

TABLE 1

Parameters of light emitting technology in relation to light emitting phosphor powders of nitride chloride

| No | Composition of Phosphor Powder | Chromaticity Coordinate (X.Y) | Color Temperature (K) | Maximal Wavelength of Spectrum (nm) | Maximal Half-width (nm) | L |
|---|---|---|---|---|---|---|
| 1 | $(Gd_{0.75}Tb_{0.01}Lu_{0.01}Y_{0.2}Ce_{0.028}Dy_{0.002})_3Al_2[Al(O_{0.9}Cl_{0.05}N_{0.05})_4]_3$ | 0.4665 0.4281 | 2742 | 581.1 | 128.1 | 24712 |
| 2 | $(Gd_{0.75}Tb_{0.03}Lu_{0.01}Y_{0.18}Ce_{0.028}Dy_{0.002})_3Al_2[Al(O_{0.9}Cl_{0.05}N_{0.05})_4]_3$ | 0.4652 0.4276 | 2755 | 581.7 | 127.1 | 27216 |
| 3 | $(Gd_{0.75}Tb_{0.1}Lu_{0.02}Y_{0.1}Ce_{0.028}Dy_{0.002})_3Al_2[Al(O_{0.9}Cl_{0.05}N_{0.05})_4]_3$ | 0.4639 0.4281 | 2777 | 580.9 | 128.6 | 26279 |
| 4 | $(Gd_{0.75}Tb_{0.1}Lu_{0.02}Y_{0.1}Ce_{0.028}Dy_{0.002})_3Al_2[Al(O_{0.82}Cl_{0.09}N_{0.09})_4]_3$ | 0.4620 0.4249 | 2779 | 583.3 | 132.4 | 25566 |
| 5 | $(Gd_{0.7}Tb_{0.01}Lu_{0.01}Y_{0.25}Ce_{0.028}Dy_{0.001}Pr_{0.001})_3Al_2[Al(O_{0.9}Cl_{0.05}N_{0.05})_4]_3$ | 0.4388 0.4195 | 3091 | 609.6 | 125.8 | 21527 |
| 6 | $(Gd_{0.75}Y_{0.23}Ce_{0.03})_3Al_2[(Al(O)_4]_3$ standard | 0.43 0.42 | 3200 | 581.9 | 130 | 23300 | altered from $a_Y$=12.00 Å to $a_{Gd}$=12.11 Å or from $a_{Tb}$=11.912 Å to $a_{Lu}$=11.909 Å. The values of the lattice parameters can be added by 3~4% when 5% of large-particle cerium ions ($Ce^{+3}$) and/or praseodymium ions ($Pr^{+3}$) are introduced in the cation lattice.

Unlike homovalent replacement discovered in the garnet, the invention turns attention to replacement of oxygen ions ($O^{-2}$), wherein oxygen ions ($a_{O-2}$=1.40 Å) are replaced by fluoride ions with smaller ionic radius ($a_{F-1}$=1.32 Å) and this will reduce their lattice parameters.

Subsequently, the invention is going to elucidate the profiles with respect to the Taiwan Appl. No. 097123219. The figures used in the patent are as follows: FIG. 1 that depicts the whole radiation spectrum of the phosphor powder for sample 1 in table 1; FIG. 2 that depicts the whole radiation spectrum of the phosphor powder for sample 2 in table 1; FIG. 3 that depicts the whole radiation spectrum of the phosphor powder for sample 3 in table 1; FIG. 4 that depicts the whole radiation spectrum of the phosphor powder for sample 4 in table 1; FIG. 5 that depicts the whole radiation spectrum of the phosphor powder for sample 5 in table 1.

Wherein the color-temperature value of White color in FIG. 1 is 3450K, and its target value is x0=0.409, y0=0.394 respectively, and the spectral parameters of the phosphor powder in FIG. 1 are as follow: Chromaticity Coordinates: x=0.4665 y=0.4281 u=0.259 v=0.3565
Correlated Color Temperature: 2742 K
Brightness: 24712.8
Reference White: C Light Peak Wavelength: 581.8 nm
Dominant Wavelength: 582 nm Bandwidth: 128.1 nm
Purity: 0.7165 Radiant Brightness: 74.93
Color Ratio: kr=63.5% kg=26.6% kb=9.9%
Rendering Index: Ra=64.1
R1=58 R2=77 R3=90 R4=51 R5=52 R6=61 R7=80 R8=43 R9=−31 R10=43 R11=31 R12=23 R13=60 R14=94 R15=57;
the color-temperature value of White color in FIG. 2 is 3450K, and its target value is x0=0.409, y0=0.394 respectively, and the spectral parameters of the phosphor powder in FIG. 2 are as follow: Chromaticity Coordinates: x=0.4652 y=0.4276 u=0.2584 v=0.3563
Correlated Color Temperature: 2755 K
Brightness: 27216.8
Reference White: C Light Peak Wavelength: 581.7 nm
Dominant Wavelength: 582 nm Bandwidth: 127.1 nm
Purity: 0.7115 Radiant Brightness: 82.285
Color Ratio: kr=63.2% kg=26.7% kb=10.1%
Rendering Index: Ra=64.0
R1=58 R2=77 R3=90 R4=51 R5=52 R6=61 R7=80 R8=42 R9=−32 R10=43 R11=31 R12=23 R13=60 R14=94 R15=57;
the color-temperature value of White color in FIG. 3 is 3450K, and its target value is x0=0.409, y0=0.394 respectively, and the spectral parameters of the phosphor powder in FIG. 3 are as follow: Chromaticity Coordinates: x=0.4639 y=0.4281 u=0.2574 v=0.3563
Correlated Color Temperature: 2777 K
Brightness: 26279.5
Reference White: C Light Peak Wavelength: 580.9 nm
Dominant Wavelength: 581 nm Bandwidth: 128.6 nm
Purity: 0.7128 Radiant Brightness: 79.428
Color Ratio: kr=62.9% kg=26.9% kb=10.2%
Rendering Index: Ra=64.2
R1=58 R2=77 R3=90 R4=51 R5=53 R6=61 R7=80 R8=43 R9=−31 R10=43 R11=32 R12=23 R13=61 R14=94 R15=57;
the color-temperature value of White color in FIG. 4 is 3450K, and its target value is x0=0.409, y0=0.394 respectively, and the spectral parameters of the phosphor powder in FIG. 4 are as follow: Chromaticity Coordinates: x=0.4620 y=0.4249 u=0.2576 v=0.3553
Correlated Color Temperature: 2779 K
Brightness: 25566.5
Reference White: C Light Peak Wavelength: 583.3 nm
Dominant Wavelength: 582 nm Bandwidth: 132.4 nm
Purity: 0.6959 Radiant Brightness: 78.433
Color Ratio: kr=63.0% kg=26.4% kb=10.6%
Rendering Index: Ra=66.0
R1=61 R2=78 R3=90 R4=54 R5=55 R6=63 R7=81 R8=46 R9=−24 R10=46 R11=35 R12=27 R13=63 R14=94 R15=59;
and the color-temperature value of White color in FIG. 5 is 2900K, and its target value is x0=0.440, y0=0.403 respectively, and the spectral parameters of the phosphor powder in FIG. 5 are as follow: Chromaticity Coordinates: x=0.4388 y=0.4195 u=0.2453 v=0.3517
Correlated Color Temperature: 3091 K
Brightness: 21527.9
Reference White: C Light Peak Wavelength: 609.6 nm
Dominant Wavelength: 580 nm Bandwidth: 125.8 nm
Purity: 0.6215 Radiant Brightness: 65.197
Color Ratio: kr=58.1% kg=27.7% kb=14.1%
Rendering Index: Ra=69.5
R1=65 R2=81 R3=90 R4=59 R5=60 R6=68 R7=83 R8=50 R9=−20 R10=50 R11=44 R12=34 R13=67 R14=94 R15=63.

As shown in gadolinium-yttrium-aluminum garnet as standard in the table 1, there are no chloride ion ($Cl^{-1}$) and nitrogen ion ($N^{-3}$) introduced in the anion sublattice and no terbium ion ($Tb^{+3}$) and lutetium ion ($Lu^{+3}$) in the cation composition.

The values of the chromaticity coordinate of the standard in the table 1 are not high. The sum of the coordinate values $\Sigma(x+y)$ is $\Sigma(x+y) \leqq 0.85$. The maximal radiation wavelength ($\lambda$) of the standard amounts to 581 nm. The luminance decreases by 12~15%, compared with the most excellent sample of halide nitride. There also exist differences in the color temperature and the chromaticity coordinate among the samples. The color temperature (T) of the standard amounts to T=3200 K, while the parameter of the samples 1~4 does not exceed 2780 K.

With respect to advantages of the phosphor powders of halide nitride according to the invention, it is characterized in that the maximal radiation spectrum ($\lambda_{max}$) thereof amounts to 580±3 nm, which increases with the accumulations of the chemical parameter "p" in the stoichiometric formula and the main component, praseodymium (Pr), for the phosphor powder and has the maximal wavelength shift. All the requirements have been elucidated before. The maximal wavelength shifts from $\lambda$=580 nm to $\lambda$=610 nm when chloride ions ($Cl^{-1}$) and nitrogen ions ($N^{-3}$) are added in the anion lattice.

These two different mechanisms for the light emitting wavelength have not been applied for LED before. This advantage enables the composition of the phosphor powders according to the claim 1 of the invention to be realized and is characterized in that with accumulation of the p value in the stoichiometric formula, i.e. addition of an appropriate amount of chloride ions ($Cl^{-1}$) and nitrogen ions ($N^{-3}$) in the anion lattice, the maximal spectral half-width is changed from $\lambda_{0.5}$=126 nm to $\lambda_{0.5}$=132 nm.

It is indicated in the meantime that the most essential advantage of the phosphor powder according to the invention is characterized in that the sum of the coordinate values ($\Sigma(x+y)$) is $\geqq 0.88$ and that with accumulation of the "p" value in the stoichiometric formula, i.e. addition of an appropriate amount of chloride ions ($Cl^{-1}$) and nitrogen ions ($N^{-3}$) in the anion lattice, the "x" value in the sub-band of the orange-red spectrum is x>0.46 and such a low color temperature (T>3000 K) can be achieved.

The abovementioned advantage according to the invention is characterized in that with accumulation of the stoichiometric index p, i.e. addition of the content of chloride ions ($Cl^{-1}$) and nitrogen ions ($N^{-3}$) in the anion lattice, the quantum radiation increase from $\xi$=0.92 to $\xi$=0.96.

In addition, with respect to the output of effective quantum dots, a number of phosphor powders usually reduce radiation wavelength shift. In the luminance values of the phosphor powders according to the invention, the output values of the corresponding quantum radiation in the table 1 are increased.

Furthermore, the phosphor powders according to the invention have an additional feature that the particles of the phosphor powders disclosed by the applicant of this invention previously are mostly in form of an ellipse. We consider oxygen ions ($O^{-2}$) must be replaced by chloride ions ($Cl^{-1}$) and nitrogen ions ($N^{-3}$). Under this condition where oxygen ions ($O^{-2}$) are replaced by heterovalent ions, light emitting particles are enlarged and the particle shape of the standard phosphor powder is similar to ellipse, these essentially reduce the geometric magnitude of the particles. The phosphor powders according to the invention possess a fine particle size distribution.

Such a substantial advantage of the phosphor powder particles is characterized in that the material is oval-shaped and the median diameter $d_{50}$ of the particles is $d_{50}$=4.0 μm and the $d_{90}$ is $d_{90}$=10 μm.

Moreover, the invention also discloses a warm-white light emitting diode that employs an InGaN-based semiconductor heterostructure (i.e. P-N junction, not shown in the figure) as matrix and has a conversion layer of light emission (not shown in the figure) which is characterized in that this conversion layer of light emission is distributed in form of thickness uniformity on the surface of light emission and the lateral sides of the InGaN-based semiconductor heterostructure and directly comes in contact with the flat surface and the prismatic face of the InGaN-based semiconductor heterostructure.

It was indicated in the course of our invention that the main radiation surface and the light emitting conversion prismatic face had the same thickness. In case that the conversion layer of light emission has a uniform thickness, this will lead to emission of light with different tones. Such an outcome will be not allowed. The light emitting diode according to the invention is characterized in that the conversion layer of light emission has a uniform thickness, wherein first of all, polymers with a high-standard viscosity are used and the method includes combination of the suspended particles of the phosphor powder with the polymers.

This method can ensure a sufficient elimination of air bubbles in the suspension, but does not interfere with the radiation output of the heterostructure light emission. This method ensures that the particles of the phosphor powders lack of viscosity can be suspended in the suspension.

It is indicated that the realization of the advantages of the light emitting diode according to the invention is characterized in that the composition of the phosphor powders established on the conversion layer of light emission is as mentioned above. When the conversion layer of light emission is mixed with the polymers, the molecular quality is changed from M=12000 carbon units to M=20000 carbon units. The chemical bonding between the silicon atom and the oxygen atom is indicated as follows:

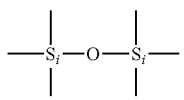

The requirements for the choice of the parameters according to the invention are described as follows: 1. the refractive parameter n thereof is ≧1.45; 2. the sufficient light transmission zone is the range of 400 to 800 nm; 3. the thermal coefficient of expansion f=100·10$^{-7}$/K; 4. the temperature zone for maintenance of a viscoelasticity is in the range from −40° C. to 120° C.; 5. a light emitting diode has standard optical stability under the condition of a long period.

The advantage of the light emitting diode according to the invention consists in the light emission converter itself that is characterized in that the weight ratio of the polymers to the particles of a phosphor powder in the conversion layer of light emission amounts to 8~75%.

In the course of our experiments, we furthermore discovered an additional property with respect to the light emitting diode according to the invention, wherein the surface of the conversion layer of light emission had a thickness of 80~200 μm and there was no undesired warm-white radiation in this conversion layer of light emission.

The following parameters for the light emission technology are acquired from the warm-white light emitting diode according to the invention, as demonstrated in the table 2.

TABLE 2

| No | Voltage resulted V | Current through heterostructure mA | Color temperature K | Light flux lumen | Light intensity 1, cd | Angle in 2θ° | Color rendering coefficient Ra |
|---|---|---|---|---|---|---|---|
| 1 | 3.61 | 350 | 2780 | 54.9 | 16.80 | 30 | 80 |
| 2 | 3.60 | 350 | 2760 | 56.2 | 17.05 | 30 | 81.5 |
| 3 | 3.62 | 350 | 2754 | 56.0 | 15.90 | 30 | 82 |

The light emission efficiency η of the light emitting diode, the power of which amounts to 1 watt, is ≧50 lumens/watt. Such a low color temperature (T>2800 K) has not been disclosed before.

Taken together, the halide phosphor powders according to the invention have a phosphor powder formula with special orange-red light emission. In addition, the halide phosphor powders according to the invention are produced in a large batch manner and hence need to draw up a procedure for a reliable technical operation. Furthermore, the halide phosphor powders according to the invention may raise the effective quantum efficiency and light emission luminance thereof. Consequently, it is possible to improve the drawbacks of the prior phosphor powders.

The invention has been disclosed in the preceding text as preferred embodiments, but they are not used to limit the invention. Any person skilled in the art may make few modifications within the spirit and scope of the invention. Hence, the protection scope of the invention shall depend on the definitions in the attached claims.

Figure 1:
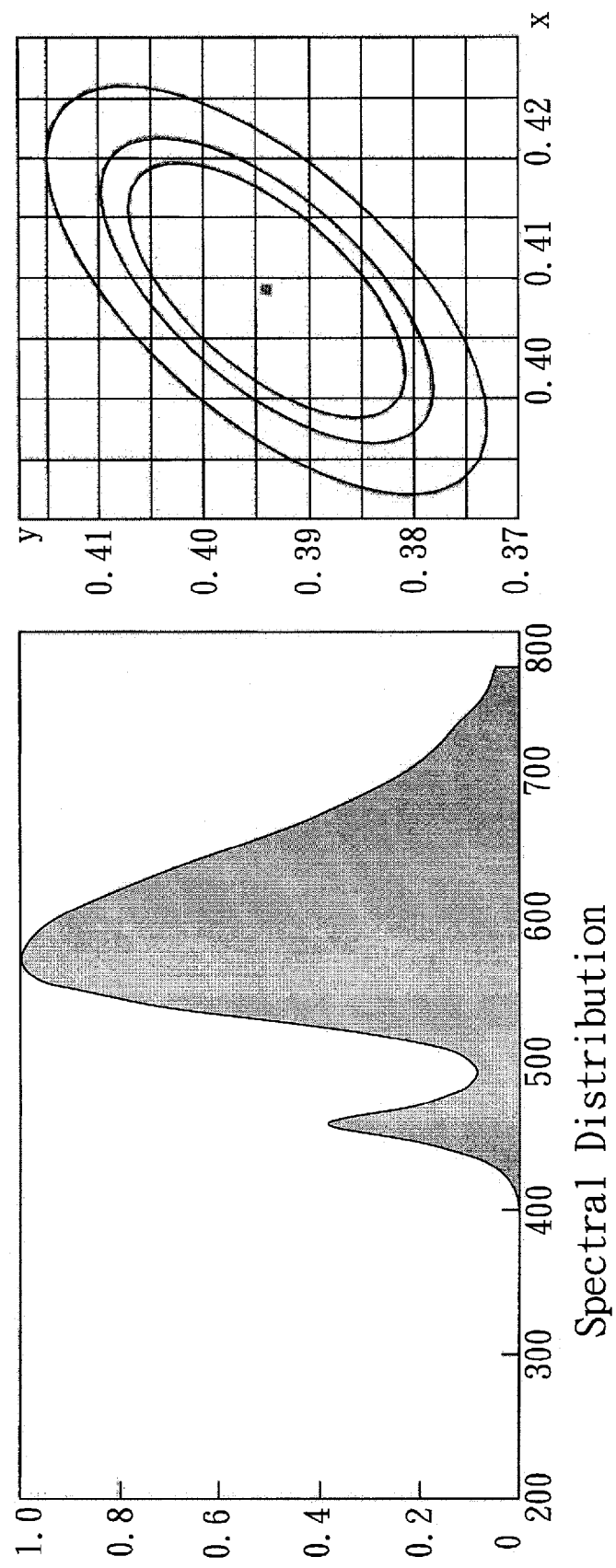
FIG. 1 is a diagram that depicts the whole radiation spectrum of the phosphor powder for sample 1 in the table 1.
Figure 2:
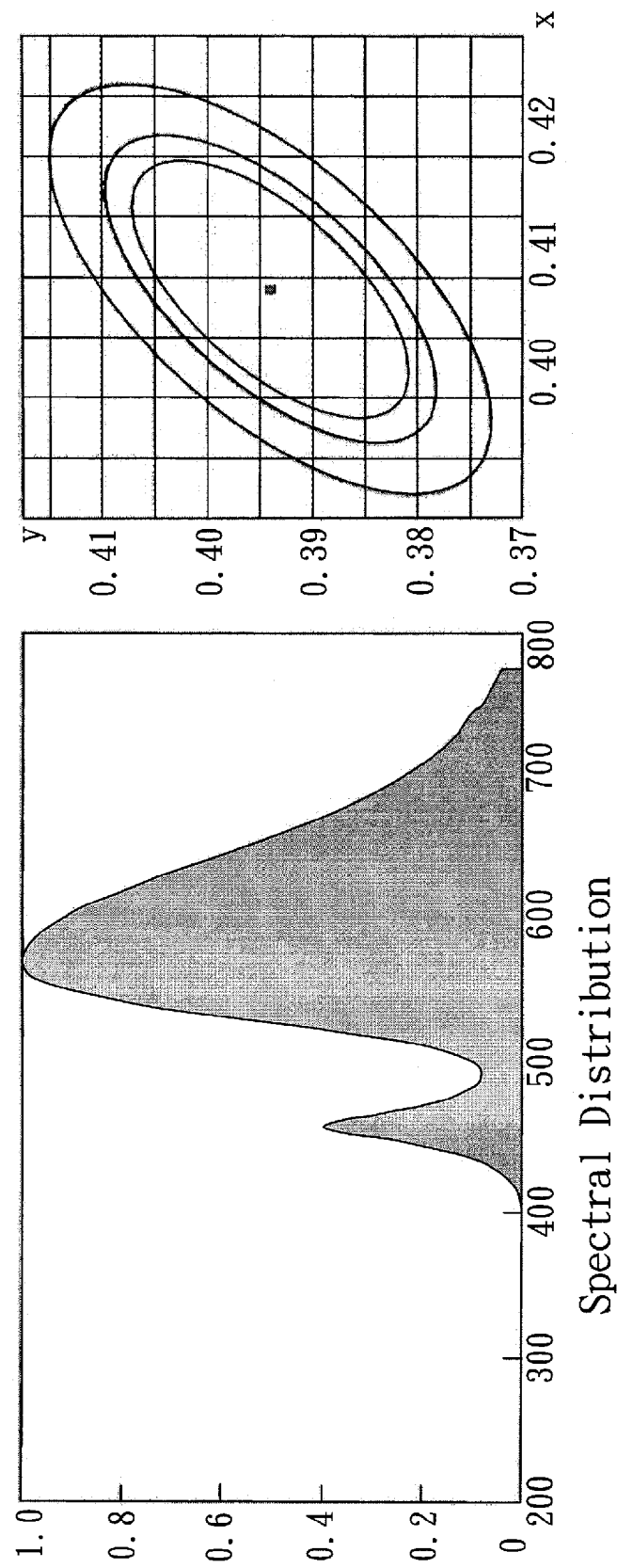
FIG. 2 is a diagram that depicts the whole radiation spectrum of the phosphor powder for sample 2 in the table 1.
Figure 3:
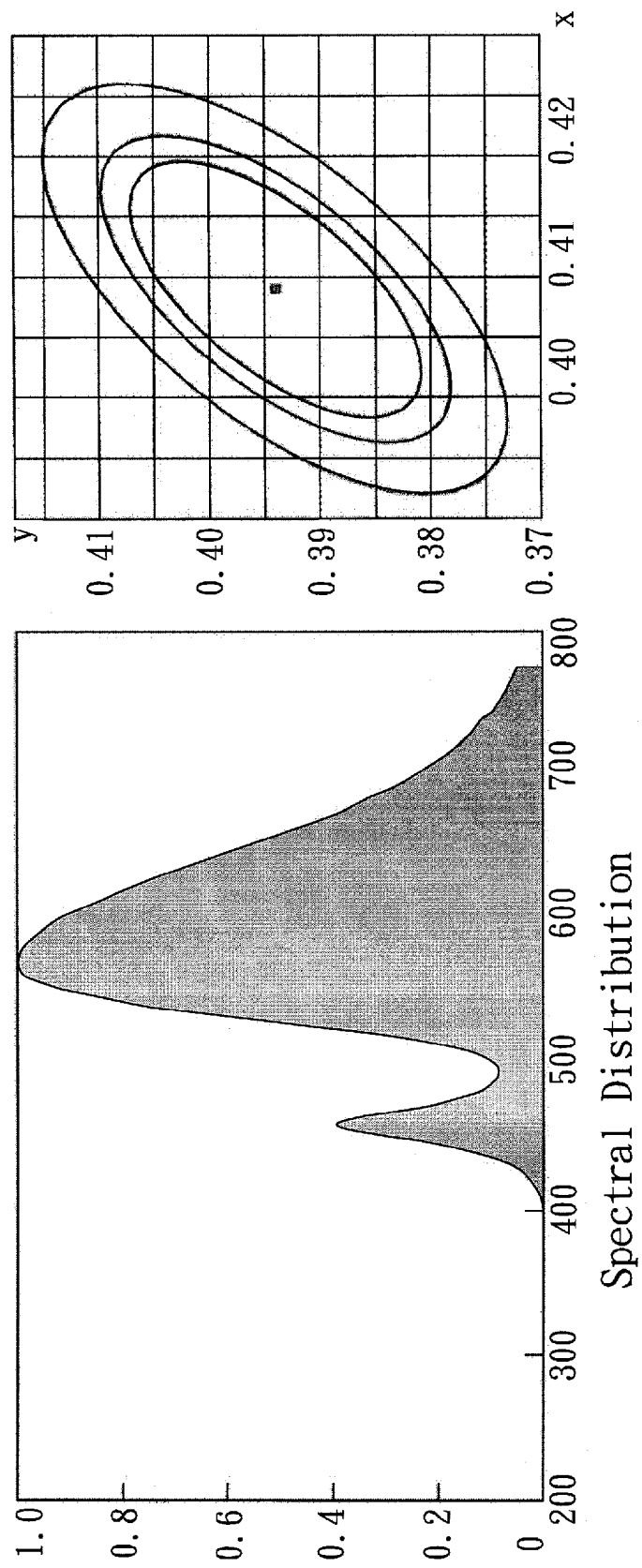
FIG. 3 is a diagram that depicts the whole radiation spectrum of the phosphor powder for sample 3 in the table 1.
Figure 4:
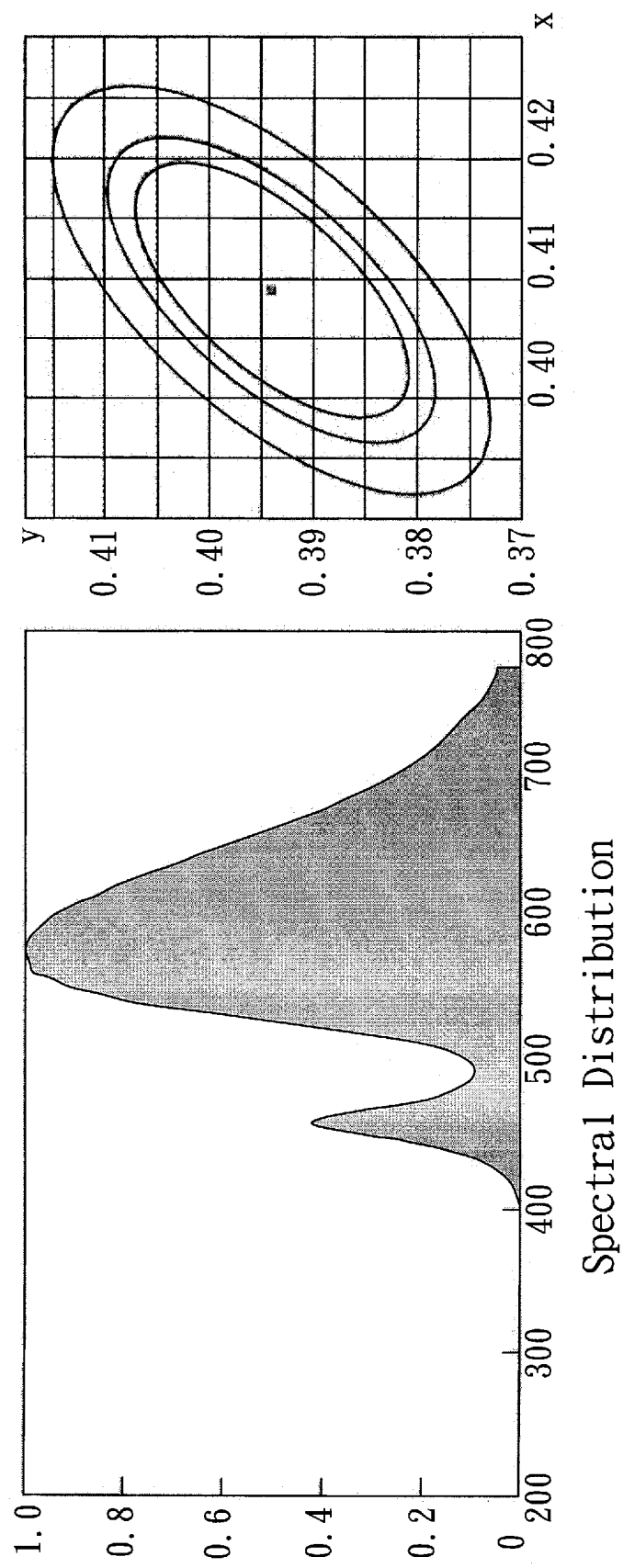
FIG. 4 is a diagram that depicts the whole radiation spectrum of the phosphor powder for sample 4 in the table 1.
Figure 5:
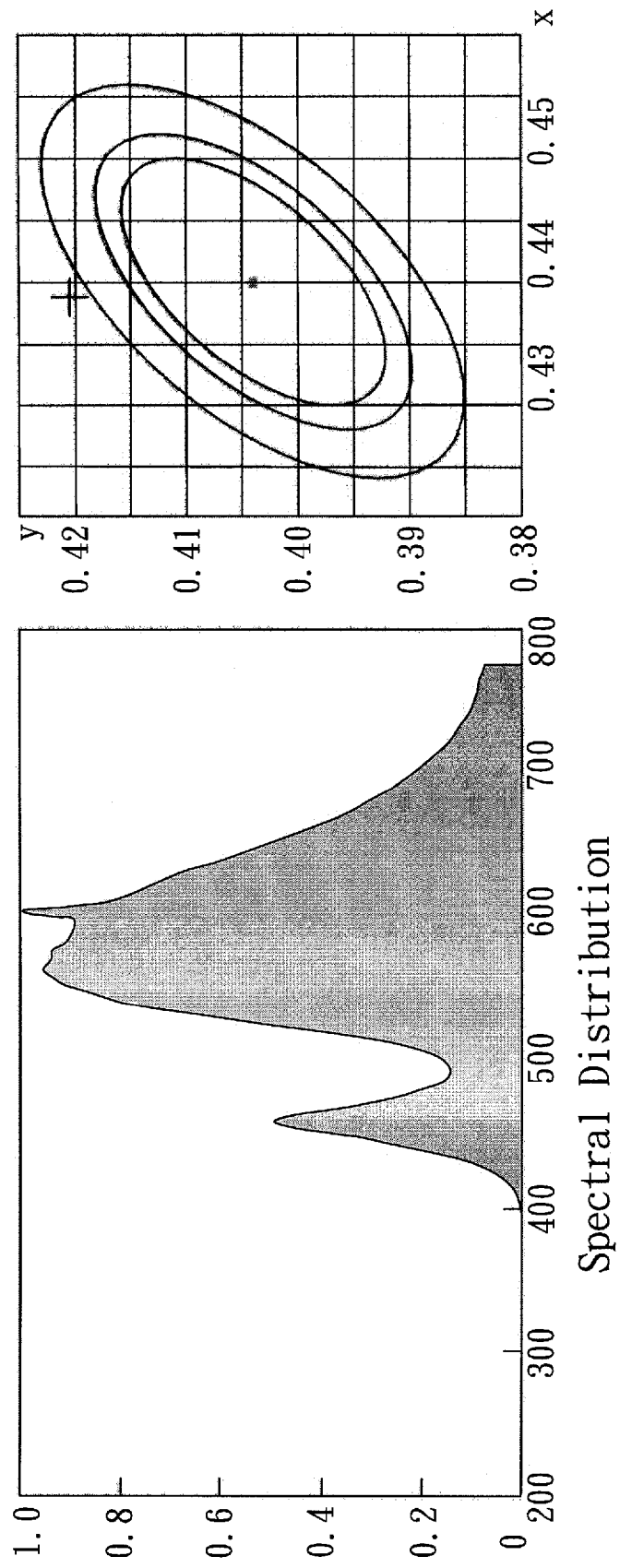
FIG. 5 is a diagram that depicts the whole radiation spectrum of the phosphor powder for sample 5 in the table 1.

What is claimed is:

1. A halide phosphor powder for a warm-white light emitting diode, the halide phosphor powder comprising:
a low-color-temperature phosphor powder of halide nitride based on garnet of rare earth oxides and having cerium as an activating agent, chloride ($Cl^{-1}$) and nitrogen ion ($N^{-3}$) are added to a composition of the phosphor powder and a stoichiometric relationship of the composition is $(\Sigma Ln^{+3})_3Al_2[(Al(O_{1-2p}Cl_pN_p)_4]_3$, wherein $\Sigma Ln$=at least one element selected from a group consisting of Y, Gd, Tb, Lu, Dy, Pr, and Ce, the chemical parameter in the stoichiometric relationship is $0.001 \leq p \leq 0.2$;

wherein, in a composition of a cation lattice, rare earth ions of the low-color-temperature phosphor powder are selected from a group consisting of $0.001 \leq (Y/\Sigma Ln) \leq 0.5$, $0.5 \leq (Gd/\Sigma Ln) \leq 0.95$, $0 \leq (Tb/\Sigma Ln) \leq 0.1$, $0 \leq (Lu/\Sigma Ln) \leq 0.05$, $0 \leq (Dy/\Sigma Ln) \leq 0.05$, $0.0001 \leq (Pr/\Sigma Ln) \leq 0.01$ and $0.01 \leq (Ce/\Sigma Ln) \leq 0.1$.

2. The halide phosphor powder according to claim 1, wherein a principal lattice parameter a of the halide phosphor powder is $a \geq 12.01$ and increases with the rise of the chemical index "p" in the formula.

3. The halide phosphor powder according to claim 1, wherein a maximal radiation wavelength ($\lambda$) in the spectrum of the halide phosphor powder amounts to 580±3 nm and shifts to a longer wavelength with the rise of the chemical index "p" in the formula.

4. The halide phosphor powder according to claim 1, wherein a spectral half width is enlarged to $\lambda_{0.5}=126+6$ nm when the chemical index "p" in the halide phosphor powder matrix increases.

5. The halide phosphor powder according to claim 1, wherein a chromaticity coordinate is enlarged to $\Sigma(x+y)>0.88$ when the chemical index "p" in the halide phosphor powder matrix increases.

6. The halide phosphor powder according to claim 1, wherein a quantum output is accumulated from $\zeta=0.92$ to $\zeta=0.96$ when the chemical index "p" in the halide phosphor powder matrix increases.

7. The halide phosphor powder according to claim 1, wherein particles of the halide phosphor powder are located on a prismatic face of an InGaN-base semiconductor heterostructure and a median particle diameter of the phosphor powder is $d_{50}=4.0$ μm or $d_{90}=16$ μm.

* * * * *